(12) United States Patent
Orita et al.

(10) Patent No.: US 10,020,440 B2
(45) Date of Patent: Jul. 10, 2018

(54) ELECTROSTRICTIVE ELEMENT AND MANUFACTURING METHOD THEREFOR

(71) Applicant: HONDA MOTOR CO., LTD., Tokyo (JP)

(72) Inventors: Atsuo Orita, Saitama (JP); Hidefumi Nikawa, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 283 days.

(21) Appl. No.: 14/724,246

(22) Filed: May 28, 2015

(65) Prior Publication Data

US 2016/0351782 A1  Dec. 1, 2016

(51) Int. Cl.
| | |
|---|---|
| H01L 41/29 | (2013.01) |
| H01L 41/053 | (2006.01) |
| H01L 41/113 | (2006.01) |
| H01L 41/107 | (2006.01) |
| H01L 41/047 | (2006.01) |
| H01L 41/083 | (2006.01) |
| H01L 41/193 | (2006.01) |
| H01L 41/297 | (2013.01) |
| H01L 41/00 | (2013.01) |

(52) U.S. Cl.
CPC ...... *H01L 41/0478* (2013.01); *H01L 41/0471* (2013.01); *H01L 41/0536* (2013.01); *H01L 41/0835* (2013.01); *H01L 41/193* (2013.01); *H01L 41/297* (2013.01)

(58) Field of Classification Search
CPC ............ H01L 41/0478; H01L 41/0471; H01L 41/0835; H01L 41/297
See application file for complete search history.

(56) References Cited

U.S. PATENT DOCUMENTS

| | | | | |
|---|---|---|---|---|
| 6,664,718 B2 * | 12/2003 | Pelrine | ............... | F04B 35/00 310/330 |
| 7,521,840 B2 * | 4/2009 | Heim | ............... | F04B 43/0054 310/330 |
| 7,608,989 B2 * | 10/2009 | Heydt | ............... | H04R 19/02 310/317 |
| 7,898,159 B2 * | 3/2011 | Heydt | ............... | H04R 19/02 310/317 |

(Continued)

FOREIGN PATENT DOCUMENTS

| | | |
|---|---|---|
| DE | 60037433 T2 | 12/2008 |
| JP | 2003-174205 | 6/2003 |

(Continued)

OTHER PUBLICATIONS

German Office Action dated Dec. 6, 2016 with English Translation, 44 pages.

(Continued)

*Primary Examiner* — Edgardo San Martin
(74) *Attorney, Agent, or Firm* — Rankin, Hill & Clark LLP

(57) ABSTRACT

Provided are an electrostrictive element comprising film electrodes that have a good elasticity and conductivity, and a manufacturing method therefor. Film electrodes 3 of an electrostrictive element 1 are sheet-shaped carbon nanotube aggregates 6, and can expand in the fiber direction while maintaining a state in which carbon nanotubes 7 overlap with each other, when the dielectric film 2 expands.

16 Claims, 6 Drawing Sheets

(56) References Cited

U.S. PATENT DOCUMENTS

| | | | | |
|---|---|---|---|---|
| 8,076,829 B2* | 12/2011 | Chen | ................... | H01L 41/193 |
| | | | | 310/363 |
| 8,536,767 B2* | 9/2013 | Chen | ..................... | F03G 7/005 |
| | | | | 252/500 |
| 8,545,962 B2* | 10/2013 | Sheehan | ............... | B81B 3/0075 |
| | | | | 257/379 |
| 8,926,933 B2* | 1/2015 | Zhang | ................... | B82Y 10/00 |
| | | | | 423/447.1 |
| 9,476,782 B2* | 10/2016 | Suzuki | .................. | B82Y 30/00 |
| 9,579,867 B2* | 2/2017 | Kang | ................. | H01L 41/0478 |
| 9,605,363 B2* | 3/2017 | Zhang | ................... | B82Y 10/00 |
| 9,676,630 B2* | 6/2017 | Cornwell | ............ | C01B 31/0253 |
| 2003/0010910 A1* | 1/2003 | Colbert | .................. | B82Y 10/00 |
| | | | | 250/306 |
| 2011/0001398 A1* | 1/2011 | Kang | ................. | H01L 41/0478 |
| | | | | 310/363 |
| 2011/0094217 A1* | 4/2011 | Chen | ..................... | F03G 7/005 |
| | | | | 60/528 |
| 2011/0278040 A1* | 11/2011 | Zhang | .................. | B29C 70/086 |
| | | | | 174/69 |
| 2012/0107594 A1* | 5/2012 | Kang | ................. | H01L 41/0478 |
| | | | | 428/220 |
| 2013/0333374 A1* | 12/2013 | Chen | ..................... | F03G 7/005 |
| | | | | 60/528 |
| 2014/0050920 A1* | 2/2014 | Ray | ......................... | D02G 3/16 |
| | | | | 428/368 |
| 2015/0004392 A1* | 1/2015 | Hull | ....................... | C03C 25/16 |
| | | | | 428/292.1 |
| 2016/0351784 A1* | 12/2016 | Cutkosky | .............. | H01L 41/047 |
| 2016/0351785 A1* | 12/2016 | Orita | ................... | H01L 41/0478 |
| 2016/0352254 A1* | 12/2016 | Orita | ................... | H01L 41/047 |

FOREIGN PATENT DOCUMENTS

| | | | |
|---|---|---|---|
| JP | 2012167403 A | * | 9/2012 |
| WO | 2007/015710 A2 | | 2/2007 |

OTHER PUBLICATIONS

Zhang, et al. "Assembly of Carbon Nanotubes Sheets"; Electronic Properties of Carbon Nanotubes; Edited by Prof. Jose Mauricio Marulanda. 2011-ISBN: 978-953-307-499-3; URL: http:/www.intechopen.com/books/electronic-properties-of-carbon-nanotubes/assembly-of-carbon-nanotube-sheets.

X. Lepro, et al. "Spinnable Carbon Nanotube Forests Grow on Thin, Flexible Metallic Substrates"; Carbon 48 (2010), p. 3621-3627—doi:10. 1016/j. carbon. Jun. 16, 2010.

* cited by examiner

ELECTROSTRICTIVE ELEMENT AND MANUFACTURING METHOD THEREFOR

BACKGROUND OF THE INVENTION

Field of the Invention

The present invention relates to an electrostrictive element and a manufacturing method therefor.

Description of the Related Art

It is known that, when electrodes are connected with both front and back surfaces of a dielectric film composed of an elastomer and voltage is applied, the dielectric film is subjected to compressive force by the Maxwell stress (piezoelectric inverse effect) from the interfacial polarization due to electrostatic force, contracts in the thickness direction and expands in the lateral direction (the direction orthogonal to the thickness direction). In recent years, there has been considered an electrostrictive element that comprises a dielectric film and electrodes and that is driven by this principle.

As such an electrostrictive element, there has been proposed a dielectric-based drive device comprising a dielectric film that is composed of an elastomer, film electrodes that are formed inside the peripheral edges of both front and back surfaces of the dielectric film and that can expand and contract so as to follow the expansion and contraction of the dielectric film, and current collectors that are connected with the peripheral edges of the film electrodes (see Japanese Patent Laid-Open No. 2003-174205, for example).

In the electrostrictive element, when a positive or negative voltage is applied to each of the film electrodes through the current collectors, the dielectric film contracts in the thickness direction and expands in the lateral direction. Thereafter, by the stop of the application, the expanded dielectric film is restored to a nearly original shape.

The film electrode is demanded to have not only a good conductivity but also a good elasticity, in order to follow the behavior of the dielectric film for the expansion without obstructing the expansion of the dielectric film.

SUMMARY OF THE INVENTION

In conventional electrostrictive elements, there is a problem in that the conductivity cannot be ensured when the film electrode is made to be thin for ensuring the elasticity, and the elasticity cannot be ensured when the film electrode is made to be thick for ensuring the conductivity.

In view of the circumstance, the present invention has an object to provide an electrostrictive element comprising film electrodes that can surely follow the behavior of the dielectric film for the expansion and that have a good conductivity even at the time of the expansion, and a manufacturing method therefor.

For achieving the object, an electrostrictive element according to the present invention comprises: a dielectric film that is composed of an elastomer; film electrodes that are formed inside peripheral edges of both front and back surfaces of the dielectric film and that can expand and contract so as to follow expansion and contraction of the dielectric film; and current collectors each of which has one end connected with a peripheral edge of the film electrode and has the other end extend outside the dielectric film, in which each of the film electrodes is a sheet-shaped carbon nanotube aggregate or a string-shaped carbon nanotube aggregate, and is formed such that a fiber direction of the carbon nanotube aggregate coincides with an expansion-and-contraction direction of the dielectric film, the sheet-shaped carbon nanotube aggregate being a carbon nanotube aggregate in which a plurality of carbon nanotubes are oriented in the fiber direction in a state of overlapping with each other in the fiber direction, the string-shaped carbon nanotube aggregate being a carbon nanotube aggregate in which the plurality of carbon nanotubes are oriented in the fiber direction in the state of overlapping with each other in the fiber direction and are aggregated in a radial direction, and the carbon nanotube aggregate can stretch in the fiber direction while maintaining the state of overlapping with each other, when the dielectric film stretches.

In the electrostrictive element according to the present invention, when a positive or negative voltage is applied to each of the film electrodes through the current collectors, the dielectric film contracts in the thickness direction and expands in the lateral direction. Thereafter, by the stop of the application, the expanded dielectric film is restored to a nearly original shape.

Each of the film electrodes disposed on both front and back surfaces of the dielectric film is the sheet-shaped carbon nanotube aggregate in which the plurality of carbon nanotubes are oriented in the fiber direction in the state of overlapping with each other in the fiber direction, or the string-shaped carbon nanotube aggregate in which the plurality of carbon nanotubes are oriented in the fiber direction in the state of overlapping with each other in the fiber direction and are aggregated in the radial direction. Thereby, the film electrodes can expand in the fiber direction while maintaining the state in which the carbon nanotubes overlap with each other in the fiber direction, when the dielectric film expands. Therefore, the film electrodes have a good elasticity, and can surely follow the behavior of the dielectric film for the expansion.

Further, since the film electrode is the sheet-shaped carbon nanotube aggregate or the string-shaped carbon nanotube aggregate, it is possible to ensure a good conductivity, and therewith, even when the dielectric film expands, the state in which the plurality of carbon nanotubes overlap with each other in the fiber direction is maintained, allowing for the maintenance of the good conductivity, and a thin configuration.

In the electrostrictive element according to the present invention, the film electrodes may be the sheet-shaped carbon nanotube aggregates, and may be formed in a unified mariner on both front and back surfaces of the dielectric film, respectively.

Further, in the electrostrictive element according to the present invention, the film electrodes may be the string-shaped carbon nanotube aggregates, and may be formed in a radial manner on both front and back surfaces of the dielectric film, respectively. According to the electrostrictive element comprising, on both front and back surfaces of the dielectric film, the plurality of film electrodes in which the string-shaped carbon nanotube aggregates are disposed in a radial manner, by variously altering the voltage to be applied to the plurality of film electrodes and expanding the dielectric film in various shapes, it is possible to perform a more complex control, compared to the electrostrictive element comprising the unified film electrodes that are the sheet-shaped carbon nanotube aggregates.

Further, in the electrostrictive element according to the present invention, a plurality of the dielectric films may be laminated in a thickness direction.

Further, the electrostrictive element according to the present invention may comprise a frame that is provided on the peripheral edge of at least one surface of the dielectric film and that keeps the dielectric film in a stretched state.

According to the electrostrictive element comprising the frame, when a positive or negative voltage is applied to each of the film electrodes through the current collectors, the dielectric film expands inward due to the restriction of the outward expansion and projects to a side of one surface so as to have a nearly mountain shape as a whole, because the peripheral edge of the dielectric film is kept by the frame, and therefore, it is possible to perform a more complex control.

In the electrostrictive element according to the present invention, for example, it is preferable that the carbon nanotube aggregate have a thickness of 0.04 to 0.4 μm, and thereby, it is possible to obtain elasticity and conductivity. In the carbon nanotube aggregate, in the case where the thickness is less than 0.04 μm, the contact between the carbon nanotubes is obstructed, and it is sometimes difficult to ensure the conductivity, and on the other hand, in the case of exceeding 0.4 μm, the contact quantity between the carbon nanotubes increases, and it is sometimes difficult to ensure the elasticity.

Further, for example, it is preferable that the carbon nanotube composing the carbon nanotube aggregate have a diameter of 0.4 to 50 nm and have a length of 0.4 to 10 μm, and thereby, it is possible to obtain elasticity and conductivity. It is difficult to form the carbon nanotube such that it has a diameter less than 0.4 nm, and in the case of exceeding 50 nm, it is sometimes not able to obtain the property of the carbon nanotube. Further, as for the carbon nanotube, in the case where the length is less than 0.4 μm, it is difficult for the carbon nanotubes to maintain a single orientation while overlapping with each other when the dielectric film expands, or it is sometimes impossible to ensure the elasticity, conversely, due to the enhancement of the tensile rigidity by the increase in the contact quantity between the carbon nanotubes, and in the case of exceeding 10 μm, the expansion sometimes decreases the conductivity and decreases the effect.

Further, in the electrostrictive element according to the present invention, as the dielectric film, a dielectric film including one type of resin material selected from a group consisting of silicone, polyurethane and polyethylene can be used.

Further, the dielectric film, on at least one surface, may comprise an adhesion layer composed of an adhesive or an acrylic adhesive whose base compound is the same resin material as the resin material composing the dielectric film. In this case, the adhesion layer allows the film electrode to suitably adhere to the dielectric film, and furthermore, since the adhesion layer has an elasticity and relative permittivity equal to or higher than the resin material composing the dielectric film, the elasticity and relative permittivity of the dielectric film are not inhibited.

Further, as the frame, one type of resin material selected from a group consisting of ABS (acrylonitrile-butadiene-styrene copolymer), polyacetal, polyether ketone and a glass-fiber reinforced resin, or one type of inorganic material selected from a group consisting of a reinforced glass including a compressive layer on a surface, and a ceramic can be used.

Further, the electrostrictive element according to the present invention that comprises the unified film electrodes on both front and back surfaces of the dielectric film respectively and in which the film electrodes are composed of the sheet-shaped carbon nanotube aggregates can be advantageously produced by a manufacturing method for the electrostrictive element comprising: a step of providing the frame on the peripheral edge of at least one surface of the dielectric film composed of an elastomer and keeping the dielectric film in a stretched state by the frame; a step of forming a sheet-shaped carbon nanotube aggregate by alignedly pulling a plurality of carbon nanotubes from a carbon nanotube forest in which the plurality of the carbon nanotubes have grown on a substrate; a step of forming the film electrode by performing a die cutting of the sheet-shaped carbon nanotube aggregate into a predetermined shape; and a step of providing the film electrode inside the peripheral edge of at least one surface of the dielectric film kept in the stretched state, such that the fiber direction of the carbon nanotube aggregate coincides with the expansion-and-contraction direction of the dielectric film.

Further, the electrostrictive element according to the present invention that comprises the plurality of film electrodes disposed in a radial manner on both front and back surfaces of the dielectric film respectively and in which the film electrodes are the string-shaped carbon nanotube aggregates can be advantageously produced by a manufacturing method for the electrostrictive element comprising: a step of providing the frame on the peripheral edge of at least one surface of the dielectric film composed of an elastomer and keeping the dielectric film in a stretched state by the frame; a step of forming string-shaped carbon nanotube aggregates by alignedly pulling and aggregating in the radial direction a plurality of carbon nanotubes from a carbon nanotube forest in which the plurality of the carbon nanotubes have grown on a substrate; and a step of forming the plurality of the film electrodes by providing the plurality of the string-shaped carbon nanotube aggregates in the radial manner inside the peripheral edge of at least one surface of the dielectric film kept in the stretched state.

Further, in the manufacturing method for the electrostrictive element according to the present invention, by further comprising a step of laminating, in a thickness direction, a plurality of the dielectric films on each of which the film electrode has been provided, it is possible to obtain an electrostrictive element in which the plurality of the dielectric films have been laminated in the thickness direction. Further, by providing the film electrode on the dielectric film that is kept in a stretched state by providing the frame on the peripheral edge of at least one surface in the step of providing the film electrode, it is possible to produce an electrostrictive film in which the frame for keeping the dielectric film in the stretched state has been provided on the peripheral edge of the dielectric film.

DETAILED DESCRIPTION OF THE PREFERRED EMBODIMENTS

[First Embodiment]

Figure 1:
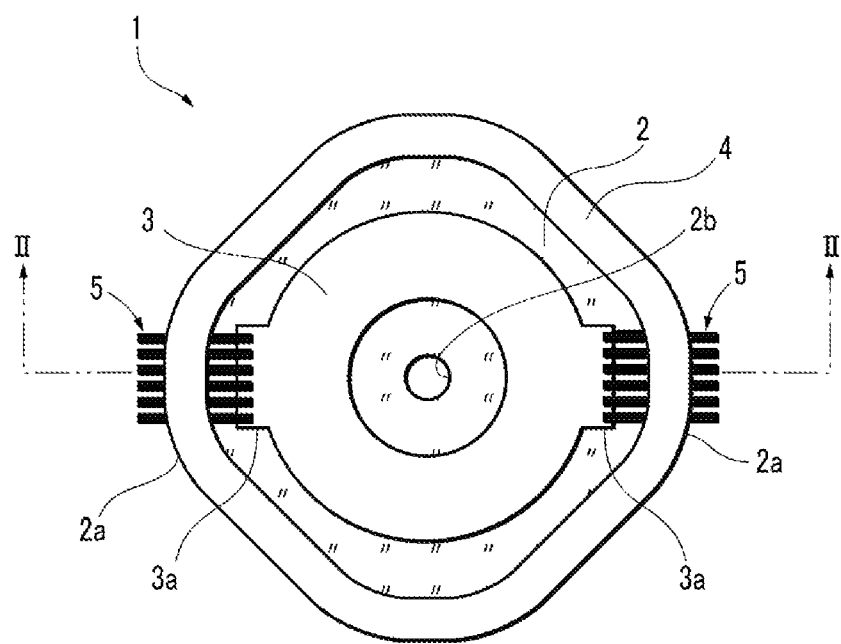
FIG. 1 is a plan view showing an electrostrictive element according to a first embodiment of the present invention.
Figure 2:
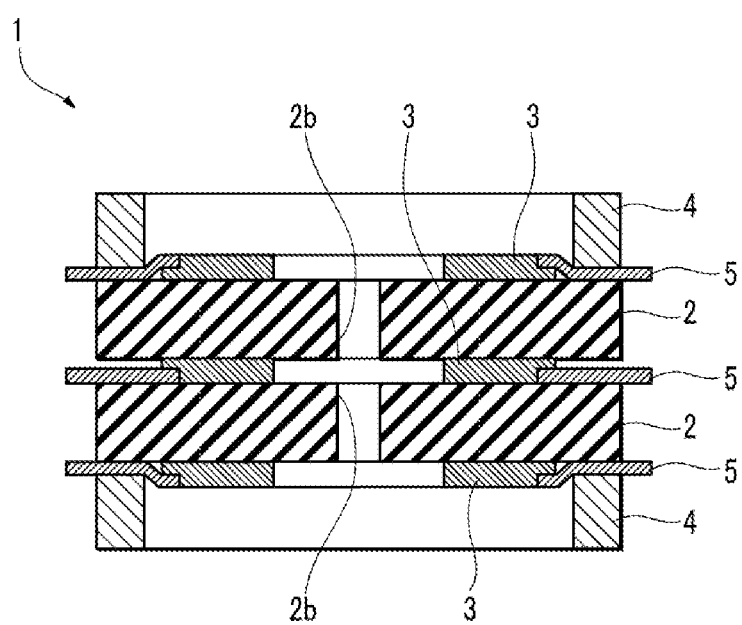
FIG. 2 is a cross-section view taken from line in FIG. 1.

An electrostrictive element 1 according to a first embodiment shown in FIG. 1 and FIG. 2 comprises two dielectric films 2 composed of an elastomer, film electrodes 3 formed inside the peripheral edges of each of the dielectric films 2, a rim type frame 4 to keep the dielectric films 2 in a stretched state, and current collectors 5 to supply electricity to the film electrodes 3. In the embodiment, the two dielectric films 2 are laminated, but three or more dielectric films may be laminated.

Each dielectric film 2 has a nearly square shape in which corner portions 2a are rounded off and a through hole 2b is provided at the center, and is composed of an elastomer having a thickness of 20 to 100 µm, for example. The dielectric film 2 may have a circular shape instead of the nearly square shape.

As the elastomer to be used for each dielectric film 2, for example, a resin material including silicone, polyurethane or polyethylene can be used, and a dielectric matter such as barium titanate may be further included for regulating the permittivity of the dielectric film 2. Further, on one surface or both surfaces of the resin material, an adhesion layer composed of an adhesive or an acrylic adhesive whose base compound is the same resin material as the resin material composing the dielectric film 2 may be provided. The embodiment uses a sheet (the trade name of VHB 4910 (a thickness of 1000 µm) or the trade name of VHB 4905 (a thickness of 500 µm) manufactured by 3M) composed of a polyethylene film on which an adhesion layer composed of an acrylic adhesive is provided. The film electrodes 3 adhere to both front and back surfaces of each dielectric film 2.

The film electrode 3, which has a circular shape, has a shape including two projecting portions 3a that are portions facing the corner portions 2a of the dielectric film 2 and that project outward, and are a sheet-shaped carbon nanotube aggregate 6 having a thickness of 0.04 to 0.4 µm.

Figure 3A:
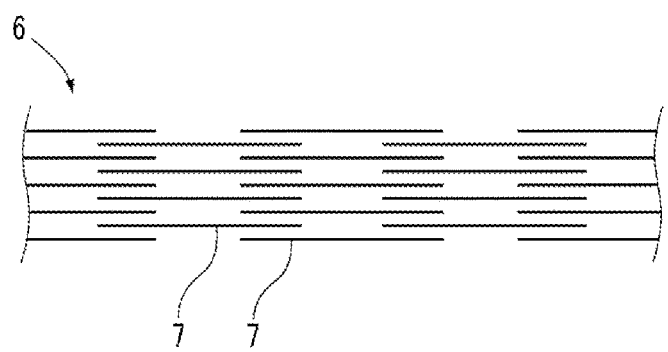
FIG. 3A is a diagram schematically showing a carbon nanotube aggregate before expansion.

As shown in FIG. 3A, the carbon nanotube aggregate 6 constituting the film electrode 3 has a sheet shape in which a plurality of carbon nanotubes 7 having a diameter of 0.4 to 50 nm and a length of 0.4 to 10 µm are oriented in the fiber direction in a state of overlapping with each other in the fiber direction.

Figure 3B:
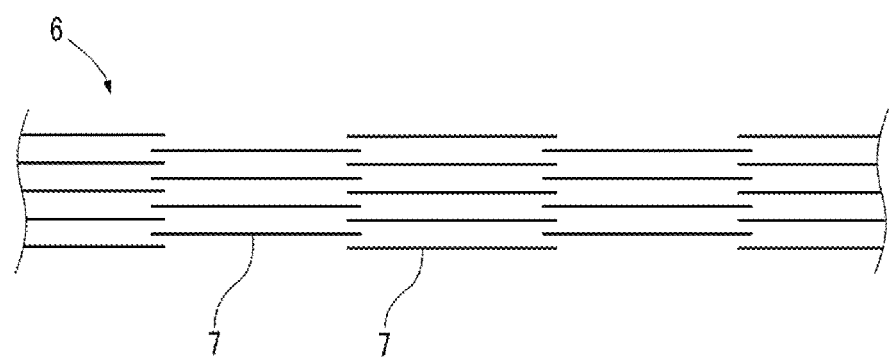
FIG. 3B is a diagram schematically showing the carbon nanotube aggregate after expansion.

As shown in FIG. 3B, the carbon nanotube aggregate 6 can expand in the fiber direction while maintaining the state in which the plurality of carbon nanotubes 7 overlap with each other in the fiber direction. Further, even at the time of the expansion, the carbon nanotube aggregate 6 maintains the state of overlapping with each other, and has a good conductivity.

The rim type frame 4 is composed of, for example, one type of resin material selected from the group consisting of ABS (acrylonitrile-butadiene-styrene copolymer), polyacetal, polyether ketone and a glass-fiber reinforced resin, or one type of inorganic material selected from the group consisting of reinforced glass including a compressive layer on the surface, and ceramics, and has an insulation property. The rim type frame 4 adheres to the peripheral surfaces of the upper surface of the dielectric film 2 on the upper side and the lower surface of the dielectric film 2 on the lower side, and keeps the dielectric films 2 in a stretched state.

In the current collector 5, one end is connected with the peripheral edge of the projecting portion 3a of the film electrode 3. As the current collector 5, it is preferable to have elasticity in addition to conductivity, and for example, the sheet-shaped carbon nanotube aggregate 6 can be used.

In the electrostrictive element 1, when a positive or negative voltage is applied to the film electrodes 3 through the current collectors 5, the dielectric films 2 expand inward due to the restriction of the outward expansion and project to the side of one surface so as to have a nearly mountain shape as a whole, because the peripheral edges of the dielectric films 2 are kept by the rim type frame 4.

The film electrodes 3 disposed on both front and back surfaces of the dielectric films 2, which are the sheet-shaped carbon nanotube aggregates 6 in which the plurality of carbon nanotubes 7 are oriented in the fiber direction, can stretch in the fiber direction while maintaining the state of overlapping with each other in the fiber direction, when the dielectric films 2 stretch, as shown in FIG. 3B, and therefore, can surely follow the behavior of the dielectric films 2 for the expansion.

Further, as for the film electrodes 3, it is possible to ensure a good conductivity because of being composed of the carbon nanotubes 7, and therewith, even when the dielectric film 2 expands, it is possible to maintain the good conductivity because the state in which the plurality of carbon nanotubes 7 overlap with each other in the fiber direction is maintained.

Further, the film electrodes 3 can be configured to be thin, and therefore, it is possible to maintain the parallel laminate state of the dielectric films 2.

Thereafter, by the stop of the application, the expanded dielectric films 2 are restored to a nearly original shape, and the film electrodes 3 follow the behavior of the dielectric films 2 for the restoration, and are restored to a nearly original shape, as shown in FIG. 3A.

In the embodiment, the electrostrictive element 1 comprising the rim type frame 4 for expanding the dielectric films 2 has been described, but an electrostrictive element not comprising the rim type frame 4 is also applicable.

The electrostrictive element 1 according to the embodiment can be produced in the following way.

First, the rim type frame 4 is disposed on the peripheral edge of one surface of the dielectric film 2 composed of the elastomer, and the dielectric film 2 is kept in a stretched state by the rim type frame 4.

Figure 4A:
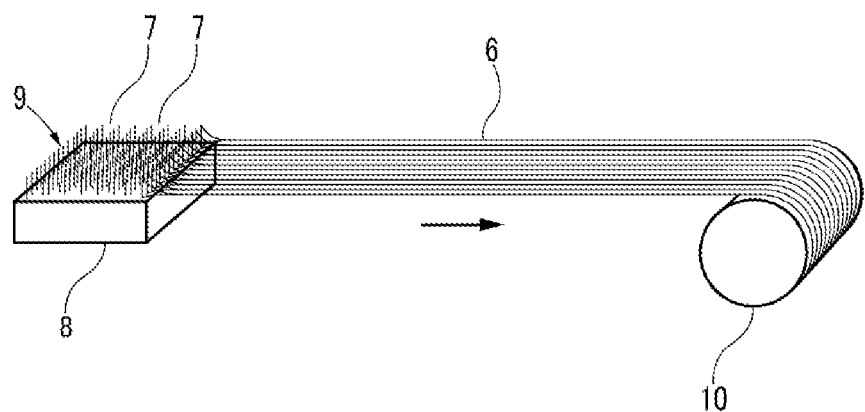
FIG. 4A is an explanatory diagram showing a step of forming a sheet-shaped carbon nanotube aggregate in a manufacturing method for the electrostrictive element according to the first embodiment.

Next, as shown in FIG. 4A, by a pullout unit such as a roller 10, the plurality of carbon nanotubes 7 are alignedly pulled from a carbon nanotube forest 9 in which the plurality of carbon nanotubes 7 have grown on a substrate 8, and thereby, the sheet-shaped carbon nanotube aggregate 6 is formed. The obtained carbon nanotube aggregate 6 is wound by the roller 10. This method is disclosed in FIG. 53 of the pamphlet of International Publication No. WO 2007/015710, for example.

Figure 4B:
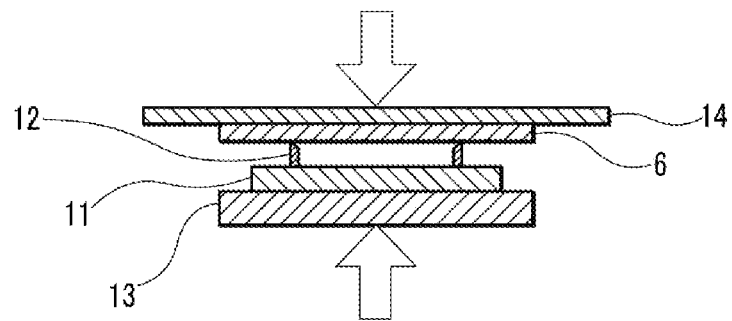
FIG. 4B is an explanatory diagram showing a step of performing the die cutting of the sheet-shaped carbon nanotube aggregate in the manufacturing method for the electrostrictive element according to the first embodiment.

Next, as shown in FIG. 4B, a cutter 12 that is held by a jig 11 and that comprises a predetermined shape (a shape comprising two projecting portions at a circular peripheral edge, in the embodiment) corresponding to the shape of the film electrode 3 is placed on the support plate 13, the sheet-shaped carbon nanotube aggregate 6 is placed so as to face the cutter 12, a presser plate 14 is placed thereon, and the press is performed from the side of the support plate 13 and the presser plate 14. Thereby, it is possible to obtain the film electrode 3 that is constituted by the sheet-shaped carbon nanotube aggregate 6 and that has been cut out into the predetermined shape (the shape comprising the two projecting portions 3a at the circular peripheral edge, in the embodiment).

Next, the obtained film electrode 3 is disposed inside the rim type frame 4 on both front and back surfaces of the dielectric film 2 kept in the stretched state by the rim type frame 4, such that the fiber direction of the carbon nanotube aggregate 6 coincides with the expansion-and-contraction direction of the dielectric film 2.

Next, the current collectors 5 are connected with the projecting portions 3a of the film electrode 3, and thereafter, a plurality of the dielectric films 2 comprising the film electrodes 3 with which the current collectors 5 have been connected are laminated in the thickness direction. Thus, it is possible to form the electrostrictive element shown in FIG. 1.

[Second Embodiment]

Figure 5:
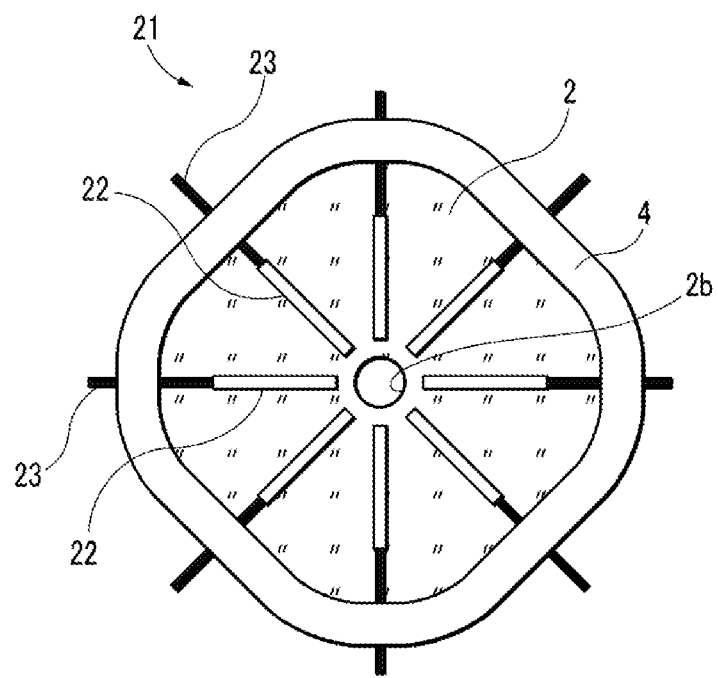
FIG. 5 is a plan view showing an electrostrictive element according to a second embodiment of the present invention.

Next, an electrostrictive element 21 according to a second embodiment will be described with reference to FIG. 5. For the same constituents as the electrostrictive element 1 according to the first embodiment, the same reference characters are assigned, and the description is omitted.

The electrostrictive element 21 comprises the two dielectric films 2 composed of the elastomer, a plurality of film electrodes 22 disposed in a radial manner inside the peripheral edge of the dielectric film 2, the rim type frame 4 to keep the dielectric films 2 in the stretched state, and current collectors 23 to supply electricity to each of the film electrodes 22. The electrostrictive element 21 according to the embodiment comprises eight film electrodes 22.

The film electrode 22 is a string-shaped carbon nanotube aggregate 24 (see FIG. 6) having a thickness of 0.04 to 0.4 µm.

The string-shaped carbon nanotube aggregate 24 has a string shape in which the plurality of carbon nanotubes 7 are oriented in the fiber direction in a state of overlapping with each other in the fiber direction and are aggregated in the radial direction, and can expand in the fiber direction while maintaining the state in which the plurality of carbon nanotubes 7 overlap with each other in the fiber direction, similarly to the sheet-shaped carbon nanotube aggregate 6 shown in FIG. 3A and FIG. 3B.

In each current collector 23, one end is connected with the end portion on the peripheral side of each film electrode 22.

In the electrostrictive element 21, when a positive or negative voltage is applied to the film electrodes 22 through the current collectors 23, the dielectric films 2 expand inward due to the restriction of the outward expansion and project to the side of one surface so as to have a nearly mountain shape as a whole, because the peripheral edges of the dielectric films 2 are kept by the rim type frame 4. On this occasion, since eight film electrodes 22 are provided, the expansion position of the dielectric film 2 varies depending on which of the positive and negative voltages are applied to the film electrode 22, and the dielectric film 2 can be transformed into a complex shape. Therefore, according to the electrostrictive element 21, it is possible to perform a complex control.

In the embodiment, the electrostrictive element 21 comprising the rim type frame 4 for expanding the dielectric films 2 has been described, but an electrostrictive element not comprising the rim type frame 4 is also applicable.

The electrostrictive element 21 according to the embodiment can be produced in the following way.

First, similarly to the case of the electrostrictive element 1, the dielectric film 2 is kept in a stretched state by the rim type frame 4.

Figure 6:
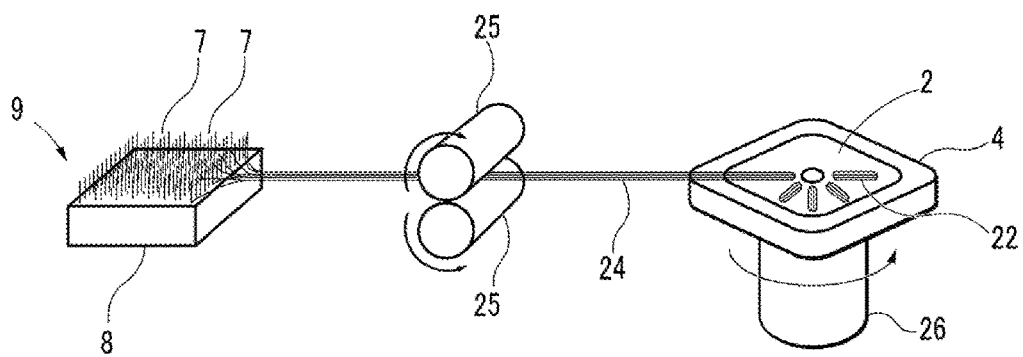
FIG. 6 is an explanatory diagram showing a manufacturing method for the electrostrictive element according to the second embodiment.

Next, as shown in FIG. 6, by a pullout unit such as rollers 25, the plurality of carbon nanotubes 7 are alignedly pulled from the carbon nanotube forest 9 in which the plurality of carbon nanotubes 7 have grown on the substrate 8, and thereby, the string-shaped carbon nanotube aggregate 24 is formed.

Next, the dielectric film 2 kept by the rim type frame 4 is placed on a rotating table 26, and while the rotating table 26 is rotated at a predetermined rotating speed, the string-shaped carbon nanotube aggregate 24 is disposed on the front surface of the dielectric film 2 and is cut out so as to have a predetermined length. On this occasion, since the dielectric film 2 is rotated by the rotating table 26, a plurality of the string-shaped carbon nanotube aggregates 24 are disposed in a radial manner on the front surface of the dielectric film 2. The number of the string-shaped carbon nanotube aggregates 24 can be altered by the rotating speed of the rotating table 26. The same operation is performed for the back surface of the dielectric film 2. Thus, it is possible to form the plurality of film electrodes 22 disposed in a radial manner, on both front and back surfaces of the dielectric film 2.

Next, the current collectors 23 are connected with the projecting portions 3a of the film electrodes 22, and thereafter, a plurality of the dielectric films 2 comprising the film electrodes 22 with which the current collectors 23 have been connected are laminated in the thickness direction. Thus, it is possible to form the electrostrictive element 21 shown in FIG. 5.

REFERENCE SIGNS LIST 1, 21 . . . electrostrictive element, 2 . . . dielectric film, 3, 22 . . . film electrode, 4 . . . rim type frame, 5, 23 . . . current collector, 6 . . . sheet-shaped carbon nanotube aggregate, 7 . . . carbon nanotube, 24 . . . string-shaped carbon nanotube aggregate

What is claimed is:

1. An electrostrictive element comprising:
a dielectric film that is composed of an elastomer;
film electrodes that are formed inside peripheral edges of both front and back surfaces of the dielectric film and that can expand and contract so as to follow expansion and contraction of the dielectric film; and
current collectors each of which has one end connected with a peripheral edge of the film electrode and has the other end extend outside the dielectric film,
wherein
each of the film electrodes is a sheet-shaped carbon nanotube aggregate or a string-shaped carbon nanotube aggregate, and is formed such that a fiber direction of the carbon nanotube aggregate of each of the film electrodes coincides with an expansion-and-contraction direction of the dielectric film,
each of the current collectors is the sheet-shaped carbon nanotube aggregate,
the sheet-shaped carbon nanotube aggregate being a carbon nanotube aggregate in which a plurality of carbon nanotubes are oriented in the fiber direction in a state of overlapping with each other,
the string-shaped carbon nanotube aggregate being a carbon nanotube aggregate in which the plurality of carbon nanotubes are oriented in the fiber direction in the state of overlapping with each other and are aggregated in a radial direction therefore,
the carbon nanotube aggregate of the sheet-shaped carbon nanotube aggregate and the string-shaped carbon nanotube aggregate can stretch in the fiber direction while maintaining the state of overlapping with each other, when the dielectric film stretches.

2. The electrostrictive element according to claim 1, wherein the film electrodes are the sheet-shaped carbon nanotube aggregates, and are formed in an unified manner on both front and back surfaces of the dielectric film, respectively.

3. The electrostrictive element according to claim 1, wherein the film electrodes are the string-shaped carbon nanotube aggregates, and are formed in a radial manner on both front and back surfaces of the dielectric film, respectively.

4. The electrostrictive element according to claim 1, wherein a plurality of the dielectric films are laminated in a thickness direction.

5. The electrostrictive element according to claim 1, comprising
a frame that is provided on the peripheral edge of at least one surface of the dielectric film and that keeps the dielectric film in a stretched state.

6. The electrostrictive element according to claim 1, wherein the carbon nanotube aggregate has a thickness in a range of 0.04 to 0.4 µm.

7. The electrostrictive element according to claim 1, wherein the carbon nanotube has a diameter in a range of 0.4 to 50 nm and has a length in a range of 0.4 to 10 µm.

8. The electrostrictive element according to claim 1, wherein the dielectric film includes one type of resin material selected from a group consisting of silicone, polyurethane and polyethylene.

9. The electrostrictive element according to claim 8, wherein the dielectric film comprises an adhesion layer on at least one surface, the adhesion layer being composed of an adhesive or an acrylic adhesive whose base compound is a same resin material as the resin material composing the dielectric film.

10. The electrostrictive element according to claim 5, wherein the frame is composed of one type of resin material selected from a group consisting of ABS (acrylonitrile-butadiene-styrene copolymer), polyacetal, polyether ketone and a glass-fiber reinforced resin, or one type of inorganic material selected from a group consisting of reinforced glass including a compressive layer on a surface, and ceramics.

11. A manufacturing method for an electrostrictive element, the electrostrictive element comprising: a dielectric film that is composed of an elastomer; unified film electrodes that are formed inside peripheral edges of both front and back surfaces of the dielectric film and that can expand and contract so as to follow expansion and contraction of the dielectric film; and current collectors each of which has one end connected with a peripheral edge of the film electrode and has the other end extend outside the dielectric film, wherein each of the film electrodes and current collectors is a sheet-shaped carbon nanotube aggregate and is formed such that a fiber direction of the carbon nanotube aggregate coincides with an expansion-and-contraction direction of the dielectric film, the sheet-shaped carbon nanotube aggregate being a carbon nanotube aggregate in which a plurality of carbon nanotubes are oriented in the fiber direction in a state of overlapping with each other in the fiber direction, and the carbon nanotube aggregate can stretch in the fiber direction while maintaining the state of overlapping with each other, when the dielectric film stretches,
the manufacturing method for the electrostrictive element comprising:
a step of forming the sheet-shaped carbon nanotube aggregate by alignedly pulling the plurality of carbon nanotubes from a carbon nanotube forest in which the plurality of the carbon nanotubes have grown on a substrate;
a step of forming the film electrode by performing a die cutting of the sheet-shaped carbon nanotube aggregate into a predetermined shape; and
a step of providing the film electrode inside the peripheral edge of at least one surface of the dielectric film that is composed of the elastomer, such that the fiber direction of the carbon nanotube aggregate coincides with the expansion-and-contraction direction of the dielectric film.

12. The manufacturing method for the electrostrictive element according to claim 11, comprising
a step of laminating, in a thickness direction, a plurality of the dielectric films on each of which the film electrode has been provided.

13. The manufacturing method for the electrostrictive element according to claim 11, wherein in the step of providing the film electrode, the film electrode is provided on the dielectric film that is kept in a stretched state by providing a frame on the peripheral edge of at least one surface.

14. A manufacturing method for an electrostrictive element, the electrostrictive element comprising: a dielectric film that is composed of an elastomer; a plurality of film electrodes that are formed in a radial manner inside peripheral edges of both front and back surfaces of the dielectric film, respectively, and that can expand and contract so as to follow expansion and contraction of the dielectric film; and current collectors each of which has one end connected with a peripheral edge of the film electrode and has the other end extend outside the dielectric film, wherein each of the film electrodes is a string-shaped carbon nanotube aggregate and each of the current collectors is a sheet-shaped carbon nanotube aggregate, and each of the film electrodes and each of the current collectors is formed such that a fiber direction of the string-shaped carbon nanotube aggregate and the sheet shaped carbon nanotube aggregate coincides with an expansion-and-contraction direction of the dielectric film, the string-shaped carbon nanotube aggregate being a carbon nanotube aggregate in which the plurality of carbon nanotubes are oriented in the fiber direction in the state of overlapping with each other in the fiber direction and are aggregated in a radial direction, the sheet-shaped carbon nanotube aggregate being a carbon nanotube aggregate in which the plurality of carbon nanotubes are oriented in the fiber direction in the state of overlapping with each other in the fiber direction, and the carbon nanotube aggregate of the sting-shaped carbon nanotube aggregate and the sheet-shaped carbon nanotube aggregate can stretch in the fiber direction while maintaining the state of overlapping with each other, when the dielectric film stretches,
the manufacturing method for the electrostrictive element comprising:
a step of forming the string-shaped carbon nanotube aggregate by alignedly pulling and aggregating in the radial direction the plurality of carbon nanotubes from a carbon nanotube forest in which the plurality of the carbon nanotubes have grown on a substrate; and
a step of forming the plurality of the film electrodes by providing a plurality of the string-shaped carbon nanotube aggregates in the radial manner inside the peripheral edge of at least one surface of the dielectric film that is composed of the elastomer.

15. The manufacturing method for the electrostrictive element according to claim 14, comprising
   a step of laminating, in a thickness direction, a plurality of the dielectric films on each of which the film electrodes have been provided.

16. The manufacturing method for the electrostrictive element according to claim 14,
   wherein in the step of providing the film electrodes, the film electrodes are provided on the dielectric film that is kept in a stretched state by providing a frame on the peripheral edge of at least one surface.

* * * * *